(12) United States Patent
Folker et al.

(10) Patent No.: US 8,116,089 B1
(45) Date of Patent: Feb. 14, 2012

(54) METHOD AND APPARATUS FOR SECURING A MAGNETIC COMPONENT TO A PRINTED CIRCUIT BOARD FOR SOLDERING

(75) Inventors: Donald Folker, Madison, AL (US); Mike LeBlanc, Huntsville, AL (US)

(73) Assignee: Universal Lighting Technologies, Inc., Madison, TN (US)

( * ) Notice: Subject to any disclaimer, the term of this patent is extended or adjusted under 35 U.S.C. 154(b) by 287 days.

(21) Appl. No.: 12/605,186

(22) Filed: Oct. 23, 2009

(51) Int. Cl.
*H05K 7/00* (2006.01)

(52) U.S. Cl. ........ 361/760; 361/773; 174/262; 174/266; 336/192

(58) Field of Classification Search ............ 361/760, 361/767, 772, 773, 782; 174/260, 262, 266; 336/200, 198, 192, 208, 223
See application file for complete search history.

(56) References Cited

U.S. PATENT DOCUMENTS

| | | | |
|---|---|---|---|
| 3,176,062 A | | 3/1965 | Nordstrom et al. |
| 3,191,135 A | * | 6/1965 | Hazelquist ........................ 336/65 |
| 3,524,156 A | | 8/1970 | Horbach |
| 4,652,975 A | * | 3/1987 | Scott ............................. 361/772 |
| 5,804,895 A | * | 9/1998 | Tsuzaki et al. .......... 310/40 MM |
| 5,805,423 A | * | 9/1998 | Wever et al. ................... 361/760 |
| 6,088,234 A | * | 7/2000 | Ishikawa et al. ............... 361/760 |
| 7,564,335 B1 | * | 7/2009 | Yang .............................. 336/192 |
| 2002/0057029 A1 | * | 5/2002 | Kataja ........................... 310/194 |
| 2005/0167155 A1 | * | 8/2005 | Matsuo .......................... 174/260 |

FOREIGN PATENT DOCUMENTS

| | | |
|---|---|---|
| JP | 61047611 | 3/1986 |
| JP | 2007080851 | 3/2007 |
| KR | 2003005450 | 1/2003 |

* cited by examiner

*Primary Examiner* — Hoa C Nguyen
(74) *Attorney, Agent, or Firm* — Waddey & Patterson, P.C.; Mark J. Patterson

(57) ABSTRACT

A magnetic device surface mounting assembly includes a specially designed printed circuit board and magnetic device. The circuit board has first and second sets of channels, the first channels having a first end of a first size, a second end of a second size, and first and second sides at least one of which taper inward between the two ends to define an opening smaller than either size. The magnetic device includes a plurality of pins extending transversely with respect to the circuit board, and a plurality of legs extending parallel with the pins and sized to pass transversely through the first end of the first set of channels and to slide laterally through and resiliently engage the opening, but to prevent transverse movement with respect to the second end of the first set of channels.

20 Claims, 4 Drawing Sheets

METHOD AND APPARATUS FOR SECURING A MAGNETIC COMPONENT TO A PRINTED CIRCUIT BOARD FOR SOLDERING

A portion of the disclosure of this patent document contains material that is subject to copyright protection. The copyright owner has no objection to the reproduction of the patent document or the patent disclosure, as it appears in the U.S. Patent and Trademark Office patent file or records, but otherwise reserves all copyright rights whatsoever.

CROSS-REFERENCES TO RELATED APPLICATIONS

Not applicable.

BACKGROUND OF THE INVENTION

The present invention relates generally to magnetic device structures. More particularly, the present invention relates to systems and methods for mounting and locking magnetic devices on printed circuit boards. Even more particularly, the present invention relates to a bobbin leg configuration permitting surface mounting of magnetic devices to the underside of printed circuit boards configured to receive them.

Designers of magnetic devices such as transformers or inductors were at one time primarily concerned with core material and size. In recent years however, mounting and packaging have become progressively more important with regards to the ability of the magnetic devices to be efficiently mounted on a printed circuit board. This ability directly relates to the total cost of the component, as space on such boards is generally limited. As the packaging or housing sizes for electronic apparatuses also become smaller and flatter, the height of the magnetic components on printed circuit boards also becomes critical. Rework, inspection and production costs are also relevant factors that must be considered in magnetic device design.

On single sided printed circuit boards, the larger components are placed on the top side of the board (generally the side with no pads or traces). The surface mount parts which are normally small are placed on the bottom side of the printed circuit board (generally the side with pads and traces). Placing a larger surface mount magnetic component on the bottom side of the printed circuit board would greatly increase the height of the assembly, which is undesirable.

It is desirable, therefore, to provide a magnetic device assembly that would allow for placement of the large portion of a magnetic device on the top side of a printed circuit board while the surface mount solder joint is made to the bottom of the printed circuit board.

BRIEF SUMMARY OF THE INVENTION

The present invention is a system and method for inserting and locking a magnetic device in place on the top surface of a printed circuit board for facilitating surface mounting of the magnetic device on the bottom surface of the printed circuit board.

The magnetic device is wound on a bobbin which incorporates in a particular embodiment four terminating pins and two elongated legs. The magnetic device is inserted into a printed circuit board from the top side of the board through two sets of channels that are specially designed for the pins and the legs. The legs go in the outside channels of the designed configuration and the pins go in the inside channels. The magnetic component is placed into ends of each channel that are larger and then slid toward the opposite end of each channel. While sliding the magnetic component laterally through the channels, the extended legs on the bobbin will be pressed toward the center of the magnetic component and subsequently spring back to their original position upon arriving at the opposite end.

This locks the magnetic device in place for surface mounting such as for example by soldering. The magnetic component cannot be lifted out of the printed circuit board because of the feet on the distal end of the extended bobbin legs which are then under the printed circuit board.

In one embodiment of the present invention, a magnetic device surface mounting assembly includes a printed circuit board having a first surface, a second surface, a first set of one or more channels having a first configuration extending from the first surface to the second surface, and a second set of one or more channels having a second configuration extending from the first surface to the second surface. The first and second surfaces define a width. The first channel configuration further includes a first end having a first size, a second end having a second size, a first side and a second side. The first and second sides extend in a non-parallel manner between the first end and the second end to define an opening having a width less than either of the first or second sizes. The magnetic device has a body further including at least one base and a plurality of pins extending transversely from the at least one base, and a plurality of legs, each leg having a first portion attached to the body and extending parallel with the pins. Each leg has a second portion positioned distally from the body.

In another embodiment of the present invention, a magnetic device is provided for mounting on a laterally oriented printed circuit board having a top surface, a bottom surface, and a first and second plurality of apertures extending through the printed circuit board from the top surface to the bottom surface. The first plurality of apertures has a first size, a second size, and a middle portion tapering to a width smaller than either of the first size and the second size. The magnetic device further including a plurality of legs having an extending portion and an end portion. Each end portion is arranged to pass transversely through the first size of the first plurality of apertures and define a first position. Each extending portion is arranged to slide laterally through the width of the tapered portion of the first plurality of apertures from the first position to define a second position. A plurality of pins are arranged to pass transversely through the second plurality of apertures, and further arranged to slide laterally from the first position to the second position.

A method of surface mounting a magnetic device in accordance with an embodiment of the present invention includes providing a printed circuit board having a first surface, a second surface, and a first set of one or more apertures each having a first end of a first size, a second end of a second size and a connecting portion tapering to an opening adjacent the second end and having a width less than the second size. The method further includes providing a magnetic device having one or more support portions and further having one or more legs extending from the device transverse to the support portions, with each leg having a distal portion with a size less than the first end of the apertures and greater than the second end of the apertures. The method also includes placing the magnetic device into a first position with the support portions engaging the first surface of the circuit board by inserting the plurality of legs transversely through the first ends of the first set of apertures and sliding the magnetic device laterally along the first set of apertures toward the second ends. The legs are arranged to resiliently engage the tapering portions.

Further, the method includes placing the magnetic device into a second position engaging the circuit board by sliding the one or more legs laterally into the second ends of the first set of apertures, with the distal portions of said legs secured from transverse movement relative to the second surface of the circuit board.

DETAILED DESCRIPTION OF THE INVENTION

Throughout the specification and claims, the following terms take at least the meanings explicitly associated herein, unless the context dictates otherwise. The meanings identified below do not necessarily limit the terms, but merely provide illustrative examples for the terms. The meaning of "a," "an," and "the" may include plural references, and the meaning of "in" may include "in" and "on." The phrase "in one embodiment," as used herein does not necessarily refer to the same embodiment, although it may. The term "coupled" means at least either a direct electrical connection between the connected items or an indirect connection through one or more passive or active intermediary devices. The term "circuit" means at least either a single component or a multiplicity of components, either active and/or passive, that are coupled together to provide a desired function. "Printed circuit board" and "printed wiring board" may be used within this description interchangeably and are intended to have the meanings commonly understood within the art.

Referring generally to FIGS. 1A-4B, a magnetic device able to be located on the top surface of a printed circuit board and slidably moved into a locked position prior to surface mounting of the magnetic device to the bottom surface of the circuit board is herein described.

Figure 1A:
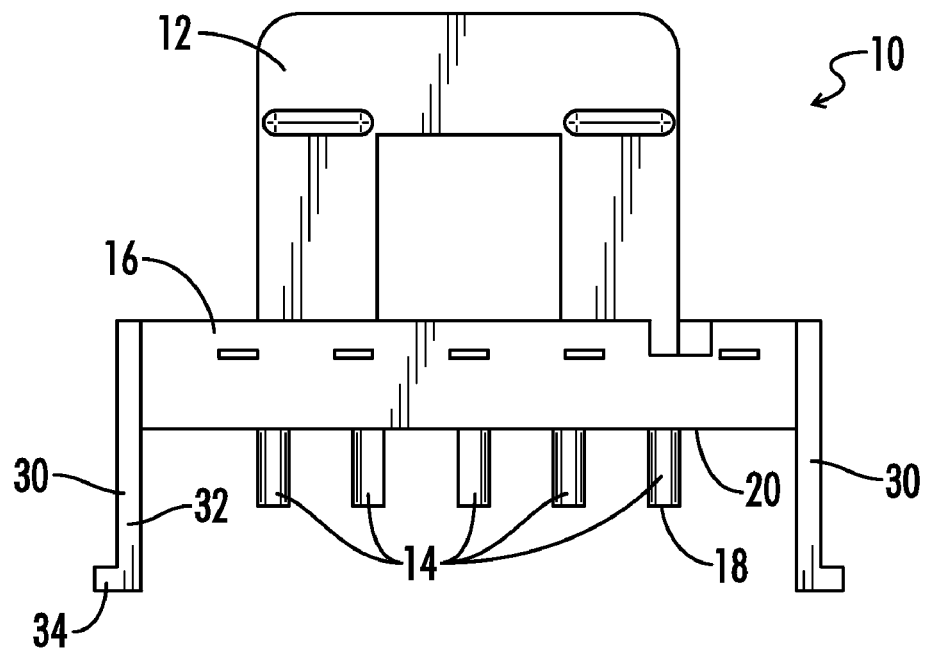
FIG. 1A is a side view of an embodiment of the magnetic device of the present invention.
Figure 1B:
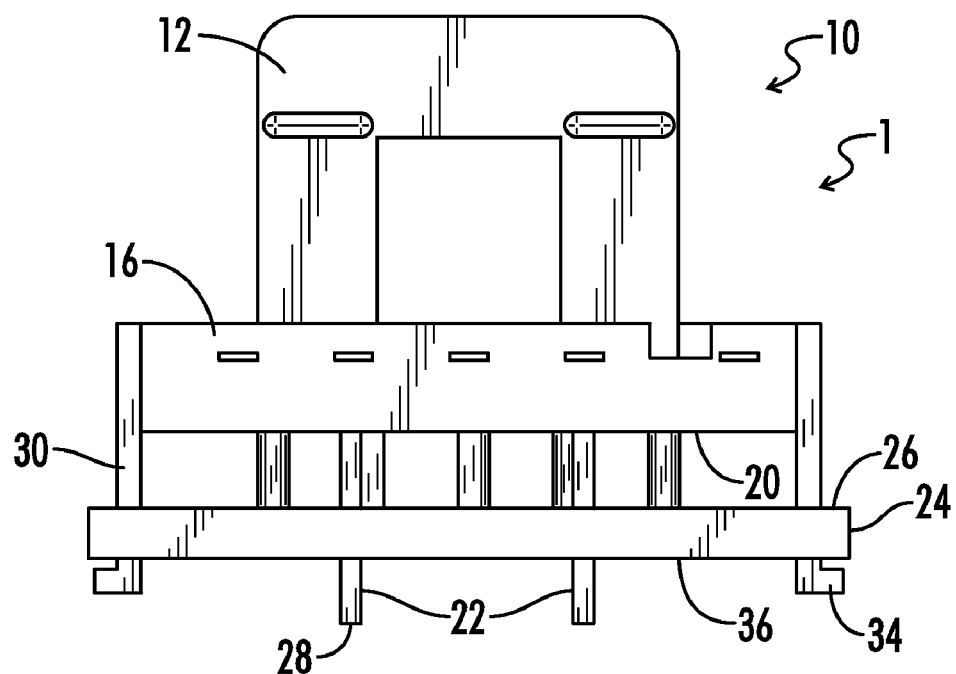
FIG. 1B is a side view of a magnetic device surface mount assembly of the present invention showing the magnetic device of FIG. 1A with a printed circuit board.

Referring first to FIGS. 1A-1B, in an embodiment of the present invention the magnetic device 10 may comprise a transformer or an inductor having a bobbin 12 and a winding axis about which may be wound a coil (not shown). The winding axis may be perpendicular to or parallel with the surface of a printed circuit board (PCB) 24, depending on the application and without substantially affecting the inventive features of the present invention.

The magnetic device 10 of the embodiment shown further has a base 16 and a plurality of support portions 14 or support members 14. The support members 14 may be integrally extending from the base 16 or may be attached to the base 16 without affecting any of the inventive features of the invention. Each support member 14 has a face 18 shaped to engage the top surface 26 of a PCB 24 such that the weight of the magnetic device 10 may be supported by the support members 14 when so engaged. The support members 14 as shown may further extend a certain distance from the remainder of the bobbin 12 so as to stand off the bottom surface 20 of the base 16 from the top surface 26 of the PCB 24 when the magnetic device 10 is so engaged.

The magnetic device 10 of the embodiment shown further includes one or more bobbin pins 22 extending from the bottom surface 20 of the base 16 and substantially parallel with the support members 14. The bobbin pins 22 have a length extending a certain distance from the base 16 beyond the length of the support members 14. Each bobbin pin 22 has a distal portion 28 located opposite from the base 16 which extends through the printed circuit board 24 when the magnetic device 10 is inserted thereon. The pins 22 will generally be attached to the bottom surface 36 of the circuit board 24 by soldering, but may otherwise be attached by any other desired method as known in the art.

In the embodiment shown, the magnetic device 10 further includes one or more elongated bobbin legs 30 extending from the base 16 transverse to the base 16 and parallel with the support members 14 and the bobbin pins 22. Each leg 30 has a first portion 32 attached to the base 16. The first portion 32 has a distal end from which a second portion 34 of the leg 30 extends laterally and parallel with respect to the bottom surface 20 of the base 16. The second portion 34, also referred to as a foot 34 or lateral portion 34, of this embodiment further is shaped to engage the bottom surface 36 of a printed circuit board 24.

In alternative embodiments, the lateral portion 34 of the leg 30 may not extend directly from the distal end of the first portion 32, but the leg 30 may instead further include one or more additional portions of varying configuration, such as for example a curved intermediate portion between the first 32 and lateral 34 portions of the leg 30. Other configurations of the leg 30 may be anticipated within the scope of the present invention where the lateral portion 34 and the first portion 32 of the leg 30 contact the printed circuit board 24 to lock the magnetic device 10 in place.

Figure 2:
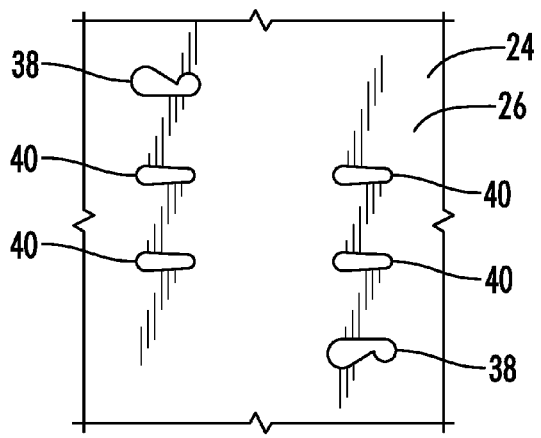
FIG. 2 is a top view of the printed circuit board of FIG. 1B.
Figure 2A:
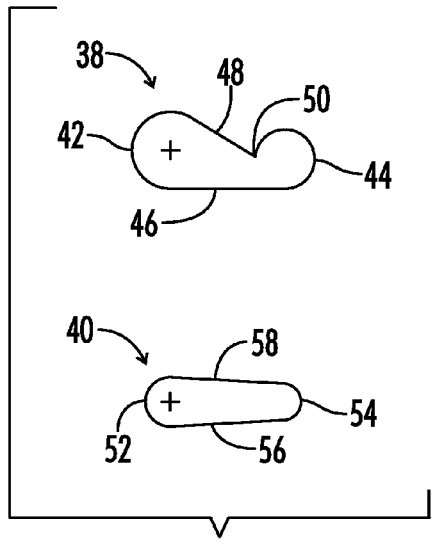
FIG. 2A is an exploded top view of the printed circuit board of FIG. 2 showing a bobbin pin aperture and a bobbin leg aperture.
Figure 2B:
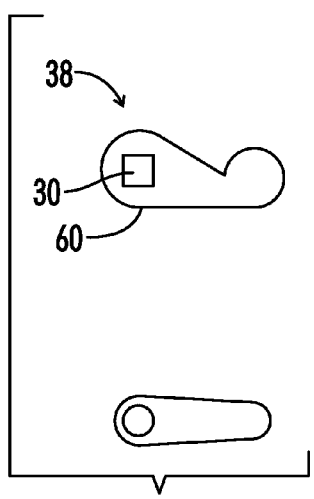
FIG. 2B is the exploded view of FIG. 2A showing a pin and a leg of the magnetic device in a first position with respect to the printed circuit board.
Figure 2C:
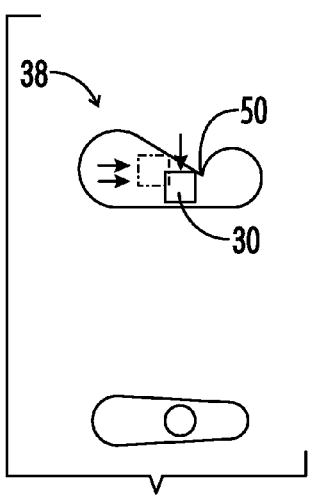
FIG. 2C is the exploded view of FIG. 2A showing a pin and a leg of the magnetic device traveling between the first and second positions with respect to the printed circuit board.
Figure 2D:
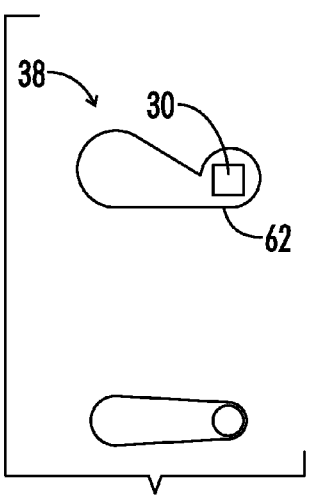
FIG. 2D is the exploded view of FIG. 2A showing a pin and a leg of the magnetic device in the second position with respect to the printed circuit board.
Figure 3:
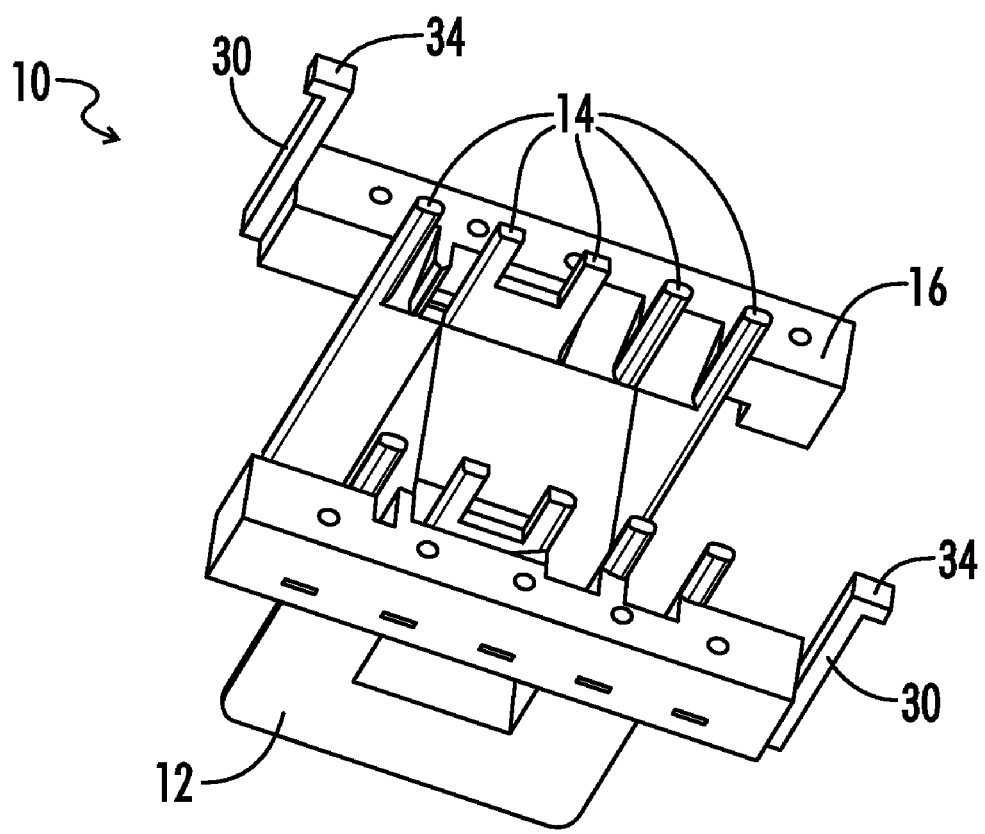
FIG. 3 is an isometric view of an embodiment of a magnetic device of the magnetic device surface mounting assembly of the present invention.
Figure 4A:
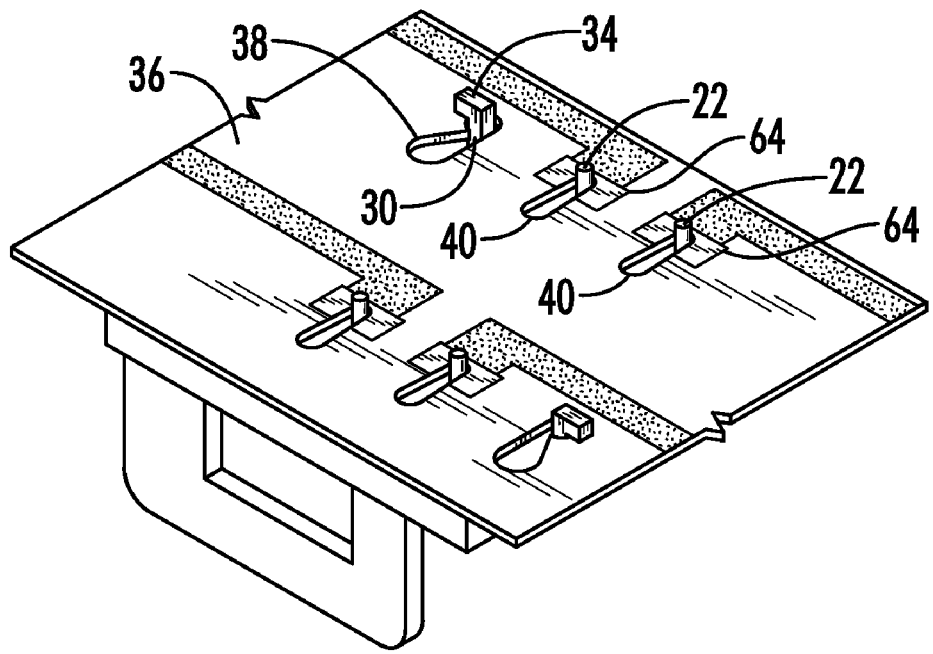
FIG. 4A is an isometric view of an embodiment of the magnetic device surface mounting assembly of FIG. 3, with the legs in locked position for surface mounting and pins not shown.
Figure 4B:
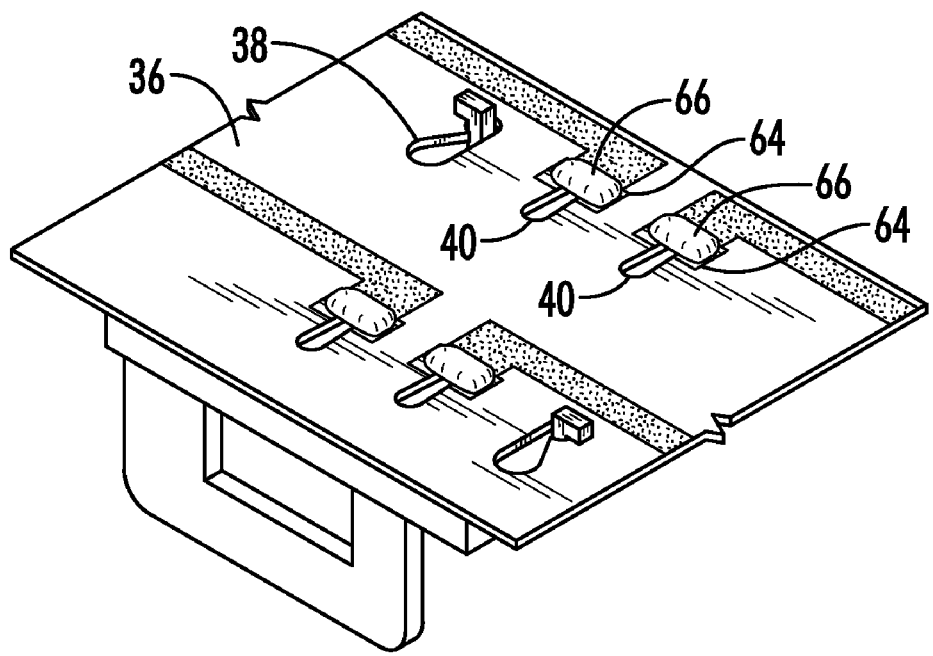
FIG. 4B is an isometric view of the magnetic device surface mounting assembly of FIG. 4A with the legs surface mounted to the printed circuit board.

Referring now to FIGS. 2-4, an embodiment of a magnetic device surface mount assembly 1 of the present invention is shown with a magnetic device positioned with respect to a printed circuit board (PCB) 24 shaped to receive and secure the magnetic device 10 when the device 10 is slid into a locked position relative to the board 24. The PCB 24 has a first surface 26 and a second surface 36. For orientation purposes only, the first surface 26 may be referred to herein as the top surface 26 and the second surface 36 may be referred to as the bottom surface 36, but these distinctions are not intended as limiting upon the ultimate orientation of the PCB 24 itself within an electronic apparatus. The first and second surfaces 26, 36 together define a width of the printed circuit board 24.

Referring now to FIG. 2, the PCB 24 has a first set of one or more apertures 38 or channels 38 at least corresponding in number to the one or more bobbin legs 30 on the magnetic device 10, each bobbin leg aperture 38 having a first configuration extending through the PCB 24 from the first surface 26 to the second surface 36.

The first aperture configuration associated with the bobbin leg apertures 38 as shown in FIG. 2 has a first end 42 and a second end 44, with a middle portion of the aperture including a first side 46 and a second side 48 coupling the two ends 42, 44. The second side 48 tapers inward toward the first side 46 as it extends from the first end 42 to the second end 44. By "tapering" it may be inferred that the second side 48 slopes, curves, or extends in any equivalent non-parallel manner with the first side 46 from the first end 42 to the second end 44. The second side 48 at no point tapers inward too far, as the smallest distance between the first side 46 and the second side 48 forms an opening 50 or neck 50 adjacent the second end 44 which is at least minutely greater than the width of the bobbin leg 30.

In various embodiments of the apertures 38, the first side 46 may be straight and the second side 48 tapered. In alternative embodiments the first side 46 may be tapered and the second side 48 straight. In still other embodiments both sides 46, 48 may taper inward as they extend from the first end 42 to the second end 44. It is also anticipated that either side 46, 48 might taper inward as they extend from the second end 44 to the first end 42. The common feature is the neck 50 adjacent to either end 42, 44 which is at least minutely larger than the bobbin leg 30.

The first end 42 has a size generally larger than that of the second end 44, such that the lateral portion 34 of the bobbin leg 30 may easily be inserted through the first end 42 of the aperture 38, while the lateral portion 34 of the bobbin leg 30 may not be inserted into or removed from the second end 44 of the aperture 38 in a direction transverse to the printed circuit board 24.

Referring again to the bobbin leg apertures 38 of the embodiment shown in FIGS. 2-4, the first ends 42 of the apertures receive the transverse portions 34 of the bobbin legs 30. The bobbin legs 30 have a length such that the transverse portions 34 extend through the printed circuit board 24 and are substantially parallel with the second surface 36. The magnetic device 10 with the legs 30 so received by the bobbin leg apertures 38 of the PCB 24 may define a first position 60 of the magnetic device 10 with respect to the PCB 24. The bobbin legs 30 may then be slid laterally along the bobbin leg apertures 38 from the first ends 42 through the necks 50 and into the second ends 44 of the apertures 38. At this point the bobbin legs 30 may not be removed from the PCB 24 in a transverse position. The magnetic device 10 with the legs 30 so received by the bobbin leg apertures 38 of the PCB 24 may thus define a second position 62 of the magnetic device 10 with respect to the PCB 24.

In various embodiments a configuration of the bobbin legs 30 may be provided to facilitate locking in place of the magnetic device 10 when located in the second position 62 with respect to the PCB 24. The bobbin legs 30 may have a first space that is defined between the one or more bobbin legs 30 when the magnetic device is separate from the PCB 24 or located in the first position 60. When the bobbin legs 30 are slid laterally from the first end 42 to the second end 44 they are unable to slide without engaging the one or more sides 46, 48 tapering inward to form the neck 50.

The bobbin legs 30 are resiliently formed such that they bend inward in engagement with the one or more tapering sides 46, 48 while sliding from the first end 42 to the second end 44. Upon arriving at the second position 62 in the second end 44, the legs 30 may resiliently return to a position substantially transverse to the orientation of the PCB 24. Alternatively, the legs 30 may maintain some bent configuration while in the second position 62. In either case the legs 30 may be far less likely to slide laterally from the second position 62 and through the neck 50 by an incidental contact or without concerted effort by a user. The magnetic device 10 in the second position 62 may be considered locked in place in accordance with the present invention.

In an alternative embodiment, the bobbin leg apertures 38 may have a first configuration in which the first and second sides 46, 48 rather than tapering from the first end 42 to the second end 44 travel in a curved or crescent orientation such that the bobbin legs 30 resiliently deform towards or away from each other, depending on the configuration, as they slide laterally from one end and then return to their normal position upon arriving at the other end. The shape of the bobbin legs 30 may be designed accordingly to facilitate movement in engagement with the one or more sides of the aperture 38. It may be anticipated that various additional designs of bobbin leg aperture configurations may generally accomplish the same locking objective within the scope of the present invention.

Referring again to FIGS. 2-4, the PCB 24 also has a second set of one or more apertures 40 or channels 40 at least corresponding in number to the one or more bobbin pins 22 on the magnetic device 10, each bobbin pin aperture 40 having a second configuration extending through the PCB 24 from the first surface 26 to the second surface 36.

The second aperture configuration associated with the bobbin leg apertures 40 as shown in FIG. 2 has a first end 52 and a second end 54, with a first side 56 and a second side 58 coupling the two ends 52, 54. The first side 56 and the second side 58 taper generally inward as they extend from the first end 52 to the second end 54. By "tapering" it may be inferred that the sides 56, 58 slope, curve, or extend in any equivalent non-parallel manner from the first end 52 to the second end 54.

In various embodiments of the bobbin pin apertures 40, the first side 56 may be straight and the second side 58 tapered. In alternative embodiments the first side 56 may be tapered and the second side 58 straight. These embodiments are generally not preferred, however, as a linear progression of each of the one or more pins 22 from one end to the other is preferred.

The first end 52 has a size generally larger than that of the second end 54, such that the bobbin pin 22 may easily be inserted through the first end 52 of the aperture 40 in association with the bobbin legs 30 being inserted through the bobbin leg apertures 38, while the bobbin pin 22 may generally be positioned in engagement with the second end 54 of the aperture 40 upon sliding the magnetic device 10 into the second position 62. The pins 22 may preferably be snugly positioned in the second position 62, so as to further prevent any undesirable sliding.

As described above, the pins 22 generally have a length so as to extend beyond the second surface 36 of the printed circuit board 24 when the magnetic device 10 is in the second position 62 with respect to the PCB 24. The second surface 36 of the PCB 24 may further have one or more solder joint areas 64 or solder pads 64 generally corresponding with the one or more pins 22 in the second position 62. The pins 22 may then be manually soldered or otherwise affixed to the second surface 36 so as to form surface mount solder joints 66 in a manner known in the art. With the magnetic device 10 effectively locked into place as a result of the magnetic device surface mounting assembly 1 of the present invention as herein described, bad solder joints or leg-outs that may otherwise result from improper extension of the pins 22 or undesired shifting of the magnetic device 10 may be substantially reduced.

Referring generally again to FIGS. 1A-4B, a method of locking a magnetic device in place on a printed circuit board and surface mounting the magnetic device is herein described, including the steps of providing a printed circuit board having a first surface, a second surface, and a first set of one or more apertures each having a first end of a first size, a second end of a second size and a connecting portion tapering to an opening adjacent the second end and having a width less than the second size; providing a magnetic device having one or more support portions and further having one or more legs extending from the device transverse to the support portions, each leg having a distal portion with a size less than the first end of the apertures and greater than the second end of the apertures; placing the magnetic device into a first position with the support portions engaging the first surface of the circuit board by inserting the plurality of legs transversely through the first ends of the first set of apertures; sliding the magnetic device laterally along the first set of apertures toward the second ends, the legs arranged to resiliently engage the tapering portions; and placing the magnetic device into a second position engaging the circuit board by sliding the one or more legs laterally into the second ends of the first set of apertures, the distal portions of said legs secured from transverse movement relative to the second surface of the circuit board.

In certain embodiments the method may further include providing a second set of apertures in the circuit board, the magnetic device further provided with a plurality of pins extending transverse from the one or more support portions, and inserting the plurality of pins transversely through the second set of apertures.

In various embodiments the method may further include soldering at least one of said pins to the second surface of the circuit board.

The previous detailed description has been provided for the purposes of illustration and description. Thus, although there have been described particular embodiments of the present invention of a new and useful "Method and Apparatus For Securing a Magnetic Component to a Printed Circuit Board For Soldering," it is not intended that such references be construed as limitations upon the scope of this invention except as set forth in the following claims.

What is claimed is:

1. A magnetic device surface mounting assembly comprising:
    a printed circuit board having a first surface, a second surface, a first set of one or more channels having a first configuration extending from the first surface to the second surface, and a second set of one or more channels having a second configuration extending from the first surface to the second surface, said first and second surfaces defining a width, said first channel configuration further comprising
        a first end having a first size,
        a second end having a second size,
        a first side and
        a second side, said first and second sides extending in a non-parallel manner between said first end and said second end to define an opening having a width less than either of the first or second size; and
    a magnetic device having a body further comprising at least one base, a plurality of pins extending transversely from the at least one base, and a plurality of legs, each leg having a first portion attached to said body and extending parallel with said pins, each leg having a second portion positioned distal from said body.

2. The assembly of claim 1, the first ends of said first set of channels arranged to receive each of said second portions of said plurality of legs in a direction transverse to an orientation of said circuit board, and the second channel configuration having a first size and a second size, said first size arranged to receive said plurality of pins in said transverse direction.

3. The assembly of claim 2, the second ends of said first set of channels having a second size arranged to deny passage of said second portions of said plurality of legs in a direction transverse to the orientation of said circuit board.

4. The assembly of claim 2, the plurality of legs and said plurality of pins so received by said first and second sets of channels of the printed circuit board defining a first position for the magnetic device.

5. The assembly of claim 4, further comprising one or more support portions extending transverse from said body and shaped to engage said first surface of said circuit board, the second portions of said plurality of legs and said support portions defining a distance, said distance minutely larger than the width of said circuit board.

6. The assembly of claim 4, said first set of channels arranged to receive each of said first portions of said plurality of legs sliding laterally from said first position, and said second set of channels arranged to receive each of said plurality of pins sliding laterally from said first position.

7. The assembly of claim 6, the plurality of legs and said plurality of pins so received defining a second position for the magnetic device.

8. The assembly of claim 7, the first portions of said plurality of legs arranged to resiliently engage said tapering sides of said first set of channels while sliding between said first and second positions, and further arranged to resiliently return to a transverse orientation with respect to said circuit board when positioned in said first or second position.

9. The assembly of claim 8, wherein the magnetic device in said second position is prevented from transverse movement with respect to said first and second surfaces of said circuit board.

10. The assembly of claim 9, the second surface of said circuit board further comprising a plurality of solder pads corresponding with said plurality of pins when said magnetic device is in said second position, wherein said solder pads facilitate surface mount soldering of said pins so as to comprise a plurality of solder joints affixing said magnetic device to said circuit board.

11. The assembly of claim 10, wherein the magnetic device in any of said second positions is prevented from transverse movement with respect to said first and second surfaces of said circuit board.

12. The assembly of claim 4, the second ends of said first set of channels arranged to slidably receive each of said first portions of said plurality of legs and thereby define a plurality of second positions for the magnetic device.

13. A magnetic device for mounting on a laterally oriented printed circuit board having a top surface, a bottom surface, and a first and second plurality of apertures extending through the printed circuit board from the top surface to the bottom surface, the first plurality of apertures having a first size, a second size, and a middle portion tapering to a width smaller than either of the first size and the second size, the magnetic device comprising:
    a plurality of legs having an extending portion and an end portion, each end portion arranged to pass transversely through the first size of the first plurality of apertures and define a first position, each extending portion arranged to slide laterally through the width of the tapered portion of the first plurality of apertures from the first position to define a second position; and a plurality of pins arranged to pass transversely through the second plurality of apertures, and further arranged to slide laterally from the first position to the second position.

14. The magnetic device of claim 13, the extending portions of each leg arranged to resiliently engage the tapered portions of the first plurality of apertures when laterally sliding from the first position to the second position.

15. The magnetic device of claim 14, the extending portions of each leg arranged to bend inward with respect to the magnetic device upon resiliently engaging the tapered portions of the first plurality of apertures, and to return to an orientation wherein the extending portions of each leg are substantially parallel when the magnetic device is in the second position.

16. The magnetic device of claim 14, the end portion of each plurality of legs larger than the second size of the first plurality of apertures, wherein the magnetic device is prevented from transverse movement when in the second position.

17. The magnetic device of claim 16, the plurality of pins having a length wherein the pins extend beyond the bottom surface of the circuit board when the device is in the first or second position.

18. A method of surface mounting a magnetic device comprising:
   (a) providing a printed circuit board having a first surface, a second surface, and a first set of one or more apertures each having a first end of a first size, a second end of a second size and a connecting portion tapering to an opening adjacent the second end and having a width less than the second size;
   (b) providing a magnetic device having one or more support portions and further having one or more legs extending from the device transverse to the support portions, each leg having a distal portion with a size less than the first end of the apertures and greater than the second end of the apertures;
   (c) placing the magnetic device into a first position with the support portions engaging the first surface of the circuit board by inserting the plurality of legs transversely through the first ends of the first set of apertures;
   (d) sliding the magnetic device laterally along the first set of apertures toward the second ends, the legs arranged to resiliently engage the tapering portions; and
   (e) placing the magnetic device into a second position engaging the circuit board by sliding the one or more legs laterally into the second ends of the first set of apertures, the distal portions of said legs secured from transverse movement relative to the second surface of the circuit board.

19. The method of claim 18, the circuit board further comprising a second set of apertures, the magnetic device further comprising a plurality of pins extending transverse from the one or more support portions, and step (c) further comprising inserting the plurality of pins transversely through the second set of apertures.

20. The method of claim 19, further comprising:
   (f) soldering at least one of said pins to the second surface of the circuit board.

* * * * *

UNITED STATES PATENT AND TRADEMARK OFFICE
CERTIFICATE OF CORRECTION

PATENT NO. : 8,116,089 B1
APPLICATION NO. : 12/605186
DATED : February 14, 2012
INVENTOR(S) : Folker et al.

It is certified that error appears in the above-identified patent and that said Letters Patent is hereby corrected as shown below:

Title Page Item (73) delete "TN" and insert --AL--.

Signed and Sealed this
Third Day of April, 2012

David J. Kappos
*Director of the United States Patent and Trademark Office*